US009728488B2

(12) United States Patent
Kusaka

(10) Patent No.: US 9,728,488 B2

(45) Date of Patent: Aug. 8, 2017

(54) ONBOARD ELECTRONIC DEVICE

(71) Applicant: TOYOTA JIDOSHA KABUSHIKI KAISHA, Toyota-shi, Aichi-ken (JP)

(72) Inventor: Hiroto Kusaka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/029,111

(22) PCT Filed: Oct. 20, 2014

(86) PCT No.: PCT/IB2014/002167

§ 371 (c)(1),
(2) Date: Apr. 13, 2016

(87) PCT Pub. No.: WO2015/059541

PCT Pub. Date: Apr. 30, 2015

(65) Prior Publication Data

US 2016/0254212 A1 Sep. 1, 2016

(30) Foreign Application Priority Data

Oct. 21, 2013 (JP) ................................ 2013-218664

(51) Int. Cl.

*H05K 7/20* (2006.01)
*H01L 23/473* (2006.01)

(Continued)

(52) U.S. Cl.

CPC ............ *H01L 23/473* (2013.01); *F28D 15/00* (2013.01); *F28F 21/084* (2013.01); *H01L 23/34* (2013.01);

(Continued)

(58) Field of Classification Search

CPC . G06F 1/181–1/182; H05K 7/20218–7/20381;

(Continued)

(56) References Cited

U.S. PATENT DOCUMENTS

2006/0113661 A1* 6/2006 Yamabuchi .......... G05D 23/192 257/706
2006/0180300 A1* 8/2006 Lenehan ................ H01L 23/34 165/247

(Continued)

FOREIGN PATENT DOCUMENTS

DE 102005035654 A1 6/2006
DE 102007023057 B3 1/2009

(Continued)

*Primary Examiner* — Anthony Haughton
*Assistant Examiner* — Razmeen Gafur
(74) *Attorney, Agent, or Firm* — Oliff PLC

(57) ABSTRACT

An onboard electronic device includes: an element that generates heat; a member that is provided between the element and a coolant cooling the element, and differs in thermal expansion coefficient from the element; an element temperature sensor that detects the temperature of the element; a coolant temperature sensor that detects the temperature of the coolant; and a controller that controls operation of the element such that the temperature of the element allowed when the temperature of the coolant is a first temperature is lower than the temperature of the element allowed when the temperature of the coolant is a second temperature that is higher than the first temperature.

8 Claims, 9 Drawing Sheets

(51) Int. Cl.
*H01L 23/34* (2006.01)
*H01L 23/373* (2006.01)
*F28D 15/00* (2006.01)
*F28F 21/08* (2006.01)
*F28D 21/00* (2006.01)

(52) U.S. Cl.
CPC ...... *H01L 23/3735* (2013.01); *H01L 23/3736* (2013.01); *F28D 2021/0028* (2013.01); *H01L 2224/32225* (2013.01); *H01L 2924/0002* (2013.01); *H01L 2924/13055* (2013.01)

(58) Field of Classification Search
CPC ........................ H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

2007/0165376 A1* 7/2007 Bones .................. H01L 25/162 361/688
2007/0230127 A1* 10/2007 Peugh .................. H01L 23/053 361/699
2007/0256810 A1* 11/2007 Di Stefano ........... H01L 23/473 165/46
2008/0093053 A1* 4/2008 Song .................... H01L 23/427 165/80.3
2009/0141451 A1* 6/2009 Mori .................. H01L 23/3675 361/699
2010/0142150 A1* 6/2010 Campbell ............ H01L 23/473 361/702
2010/0157526 A1* 6/2010 Beaupre ............... H01L 23/473 361/689
2010/0172091 A1* 7/2010 Nishiura ............ H01L 23/3735 361/689
2010/0246117 A1* 9/2010 Brunschwiler ........... G06F 1/20 361/679.53
2010/0290188 A1* 11/2010 Brunschwiler ....... H01L 23/473 361/699
2010/0290490 A1* 11/2010 Hammel ............. H01L 23/3735 372/36
2010/0302734 A1* 12/2010 Beaupre ............. H01L 23/3731 361/700
2011/0043999 A1* 2/2011 Johnston .................. B03C 3/68 361/699
2011/0141690 A1* 6/2011 Le ....................... H01L 23/4735 361/689
2011/0188203 A1* 8/2011 Smith ..................... F21V 29/02 361/699
2011/0235276 A1* 9/2011 Hentschel ............ H01L 23/473 361/699
2011/0249402 A1* 10/2011 Hentschel ............ H01L 23/473 361/699
2011/0286183 A1* 11/2011 Chiu-Mao .......... H05K 7/20218 361/699
2011/0304979 A1* 12/2011 Peterson .................. G06F 1/20 361/679.47
2011/0313576 A1* 12/2011 Nicewonger ........... F28D 15/00 700/282
2012/0001341 A1* 1/2012 Ide ........................ H01L 23/473 257/773
2012/0020023 A1* 1/2012 Nemesh ................. B60H 1/143 361/701
2012/0209449 A1* 8/2012 Alon ....................... G06F 1/206 700/300

FOREIGN PATENT DOCUMENTS

JP H05-167283 A 7/1993
JP 2005-287214 A 10/2005
JP 2006-304566 A 11/2006
JP 2008-028124 A 2/2008
JP 2008-256313 A 10/2008
JP 2010-158087 A 7/2010
JP 2012-033864 A 2/2012
JP 2012-170211 A 9/2012
JP 2013-095147 A 5/2013
JP 2013-131680 A 7/2013

* cited by examiner 1
10
C1
L1
20
Q22
D22
Q24
D24
VH
C2
30
Q1
D1
M1
Q2
D2
Q3
D3
M2
Q4
D4
Q5
D5
M3
Q6
D6
40
U
V
W
50
CONTROLLER
WATER TEMPERATURE SENSOR
60
ELEMENT TEMPERATURE SENSOR
62

ONBOARD ELECTRONIC DEVICE

BACKGROUND OF THE INVENTION

1. Field of the Invention

The invention relates to an onboard electronic device.

2. Description of Related Art

A hybrid vehicle (HV) is available in which a load factor limit of a boost converter is decreased as the temperature of a plurality of switching elements of the boost converter rises and also as the temperature of cooling water that cools the plurality of switching elements rises (see, for example, Japanese Patent Application Publication No. 2013-095147 (JP 2013-095147 A)).

However, since the switching elements of this type are typically joined by soldering, or the like, to a substrate, the switching elements are in contact with a coolant through a plurality of materials. Therefore, regarding heat generation by the switching elements, not only the heat resistance, but also thermal stresses caused by the difference in thermal expansion coefficient between the materials are problematic.

In this respect, since the only the heat resistance temperature of switching elements is considered in the configuration described in JP 2013-095147 A, fracture caused by thermal stresses can occur. For example, in the configuration described in JP 2013-095147 A, the temperature of the elements rises rather significantly when the cooling water temperature is low. However, where a comparatively large increase in the element temperature occurs, the difference between the thermal deformation amount of the switching elements and the thermal deformation amount of a material (solder, etc.) located below the switching elements increases, thereby increasing the-thermal stresses applied to the switching elements and the material. Those thermal stresses can fracture the switching elements.

SUMMARY OF THE INVENTION

Accordingly, the invention provides an onboard electronic device in which the possibility of fracture of elements caused by thermal stresses can be reduced.

According to a first aspect of the invention, an onboard electronic device includes: an element that generates heat; a member that is provided between the element and a coolant cooling the element, and differs in thermal expansion coefficient from the element; an element temperature sensor that detects a temperature of the element; a coolant temperature sensor that detects a temperature of the coolant; and a controller that controls operation of the element such that the temperature of the element allowed when the temperature of the coolant is a first temperature is lower than the temperature of the element allowed when the temperature of the coolant is a second temperature that is higher than the first temperature.

An onboard electronic device according to a second aspect of the invention includes: an element that generates heat; a member that is provided between the element and a coolant cooling the element, and differs in thermal expansion coefficient from the element; an element temperature sensor that detects a temperature of the element; and a coolant temperature sensor that detects a temperature of the coolant, wherein the temperature of the element at which output of the element declines is higher when the temperature of the coolant is a second temperature that is higher than a first temperature than when the temperature of the coolant is the first temperature.

According to the first and second aspects, the increase range of the temperature of the heat-generating element that is allowed when the coolant temperature is the first temperature is limited. Therefore, the probability of the heat-generating element being fractured by thermal stresses can be reduced.

An onboard electronic device according to a third aspect of the invention includes: an element that generates heat; a member that is provided between the element and a coolant cooling the element, and differs in thermal expansion coefficient from the element; a coolant temperature sensor that detects a temperature of the coolant; and a controller that limits operation of the element on the basis of the temperature of the coolant such that a difference between the temperature of the coolant and a temperature of the element falls within a predetermined range, wherein the range when the coolant temperature is a first temperature is equal to the range when the coolant temperature is a second temperature that is higher than the first temperature.

According to a fourth aspect of the invention, an onboard electronic device includes: an element that generates heat; a member that is provided between the element and a coolant cooling the element, and differs in thermal expansion coefficient from the element; and a temperature sensor that detects a temperature of the coolant, wherein output of the element declines when a difference between the temperature of the coolant and a temperature of the element exceeds a predetermined range, and the predetermined range when the temperature of the coolant is a first temperature is equal to the predetermined range when the temperature of the coolant is a second temperature that is higher than the first temperature.

According to the third and fourth aspects, the difference in temperature between the coolant and the element is limited not to exceed the predetermined range. Therefore, the probability of the heat-generating element being fractured by thermal stresses can be reduced. Further, since the predetermined range is the same when the coolant temperature is the first temperature and the second temperature, the probability of the heat-generating element being fractured by thermal stresses can be reduced even at a different coolant temperature.

According to the invention, it is possible to obtain an onboard electronic device in which the probability of the heat-generating element being fractured by thermal stresses can be reduced.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Embodiments of the invention will be explained below in greater detail with reference to the appended drawings.

Figure 1:
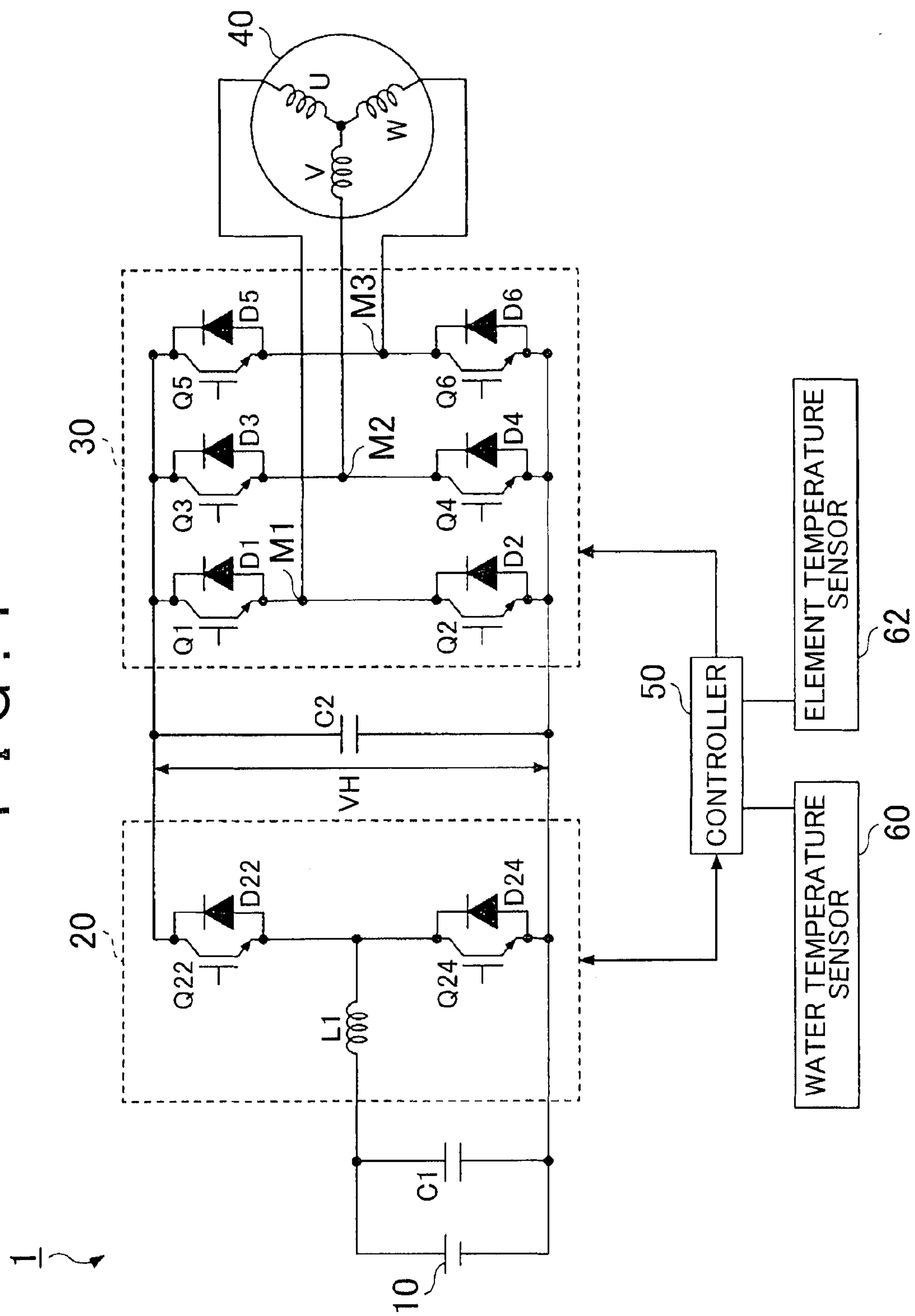
FIG. 1 illustrates an example of the entire configuration of a motor drive system 1 for an electric automobile.

FIG. 1 illustrates an example of the entire configuration of the motor drive system 1 for an electric automobile. With the motor drive system 1, a vehicle is driven by actuating a drive motor 40 with electric power from a battery 10. Details relating to the method and configuration of the electric automobile are not limited, provided that the automobile is run by actuating the drive motor 40 using the electric power. Typical examples of the electric automobile include a hybrid vehicle using an engine and the drive motor 40 as power sources and an electric vehicle using only the drive motor 40 as the power source.

As indicated in FIG. 1, the motor drive system 1 is provided with the battery 10, a direct current-direct current (DC/DC) converter 20, an inverter 30, the drive motor 40, and a semiconductor controller 50.

The battery 10 is any power storage device that stores electric power and outputs a DC voltage and may be constituted by a nickel-metal hydride battery or a lithium ion battery, or by a capacitance element such as an electric double-layer capacitor.

The DC/DC converter 20 may be a bidirectional DC/DC converter (a boost DC/DC converter 20 of a reversible chopper system). The DC/DC converter 20 may convert the voltage, for example by boosting from 200 V to 650 V and lowering from 650 V to 200 V. A smoothing capacitor C1 may be connected between a negative electrode line and the input side of a reactor (coil) L1 of the DC/DC converter 20.

In the example depicted in the figure, the DC/DC converter 20 has two switching elements Q22, Q24 and the reactor L1. The two switching elements Q22, Q24 are connected in series with each other between the positive electrode line and negative electrode line of the inverter 30. The reactor L1 is connected in series to the positive electrode side of the battery 10. The output side of the reactor L1 is connected to the connection point of the two switching elements Q22, Q24.

In the example shown in the figure, the two switching elements Q22, Q24 of the DC/DC converter 20 are insulated gate bipolar transistors (IGBT). The switching elements Q22, Q24 may be the usual IGBT using diodes (for example, free-wheel diodes) D22, D24 as external elements, or a reverse conducting-IGBT (RC-IGBT) incorporating the diodes D22, D24. In either case, the collector of the switching element Q22 of the upper arm is connected to the positive electrode line of the inverter 30, and the emitter of the switching element Q22 of the upper arm is connected to the collector of the switching element Q24 of the lower art. The emitter of the switching element Q24 of the lower arm is connected to the negative electrode line of the inverter 30 and the negative electrode of the battery 10. The switching elements Q22, Q24 may be also other switching elements different from the IGBT, for example, metal oxide semiconductor field-effect transistors (MOSFET).

The inverter 30 is constituted by U-phase, V-phase, and W-phase arms disposed in parallel to each other between the positive electrode line and negative electrode line. The U-phase arm is constituted by a serial connection of switching elements (IGBT in this example) Q1, Q2, the V-phase arm is constituted by a serial connection of switching elements (IGBT in this example) Q3, Q4, and the W-phase arm is constituted by a serial connection of switching elements (IGBT in this example) Q5, Q6. Diodes D1 to D6 are disposed, so that the electric current flows from the emitter side to the collector side, between the collector and emitter of the switching elements Q1 to Q6, respectively. The switching elements Q1 to Q6 may be other switching elements different from IGBT, for example MOSFET.

The drive motor 40 is a three-phase permanent magnet motor, and the three U-, V-, and W-phase coils are commonly connected, each by one end, at a midpoint of the drive motor 40. The other end of the U-phase coil is connected to a midpoint M1 of the switching elements Q1, Q2, the other end of the V-phase coil is connected to a midpoint M2 of the switching elements Q3, Q4, and the other end of the W-phase coil is connected to a midpoint M3 of the switching elements Q5, Q6. A smoothing capacitor C2 is connected between the collector and negative electrode line of the switching element Q1. The connection method of the three U-, V-, and W-phase coils may also be a Δ connection. Further, the drive motor 40 may be a hybrid three-phase motor in which an electromagnet and a permanent magnet are combined.

A second drive motor or a generator may be also connected in parallel in addition to the drive motor 40. In this case, the corresponding inverter is also added in parallel.

The semiconductor controller 50 controls the DC/DC converter 20 and the inverter 30. The semiconductor controller 50 may be implemented as an electronic control unit (ECU) including a microcomputer. Various functions (including the below-descried functions) of the semiconductor controller 50 may be realized by any hardware, software, and firmware, or a combination thereof. For example, various functions of the semiconductor controller 50 may be realized by an application-specific integrated circuit (ASIC) or a field programmable gate array (FPGA). Various functions of the semiconductor controller 50 may be also realized by a plurality of ECU in a cooperative manner.

Essentially any method may be used for controlling the DC/DC converter 20. Typically, the semiconductor controller 50 controls the DC/DC converter 20 according to the operation (power running or regeneration) of the inverter 30. For example, during the power running, the semiconductor controller 50 switches ON/OFF only the switching element Q24 of the lower arm of the DC/DC converter 20 (one-arm drive performed with the lower arm) to boost the voltage of the battery 10 and output the boosted voltage to the inverter 30 side. In this case, the switching element Q24 of the lower arm may be controlled by pulse width modulation (PWM). Further, during the regeneration, only the switching element Q22 of the upper arm of the DC/DC converter 20 (one-arm drive performed with the upper arm) is switched ON/OFF such that the voltage on the inverter 30 side is lowered and the lowered voltage is output to the battery 10 side. In this case, the switching element Q22 of the upper arm may be PWM controlled. Further, when the current flowing in the reactor L1 crosses 0 (at the time of zero cross), the semiconductor controller 50 may ON/OFF drive the two switching elements Q22, Q24 in counter phases (two-arm drive).

Essentially, any method may be used for controlling the inverter 30. Typically, the semiconductor controller 50

ON/OFF drives the two switching elements Q1, Q2 relating to the U phase, ON/OFF drives the two switching elements Q3, Q4 relating to the V phase, and ON/OFF drives the two switching elements Q5, Q6 relating to the W phase so that the phase currents flowing in the coils of the phases have sine waveforms shifted in phase by 120°.

A water temperature sensor 60 and an element temperature sensor 62 are connected to the semiconductor controller 50.

The water temperature sensor 60 detects the temperature of a coolant that cools the inverter 30. The coolant may be oil, water, or air, and typically is water (for example, long life coolant (LLC)). In the present example, the coolant is assumed to be water by way of example.

The element temperature sensor 62 detects the temperature of the switching elements Q1 to Q6 forming the inverter 30. The element temperature sensor 62 may be a sensor incorporated in each of the switching elements Q1 to Q6. The element temperature sensor 62 may include element temperature sensors detecting the temperature of each of the diodes D1 to D6.

Figure 2:
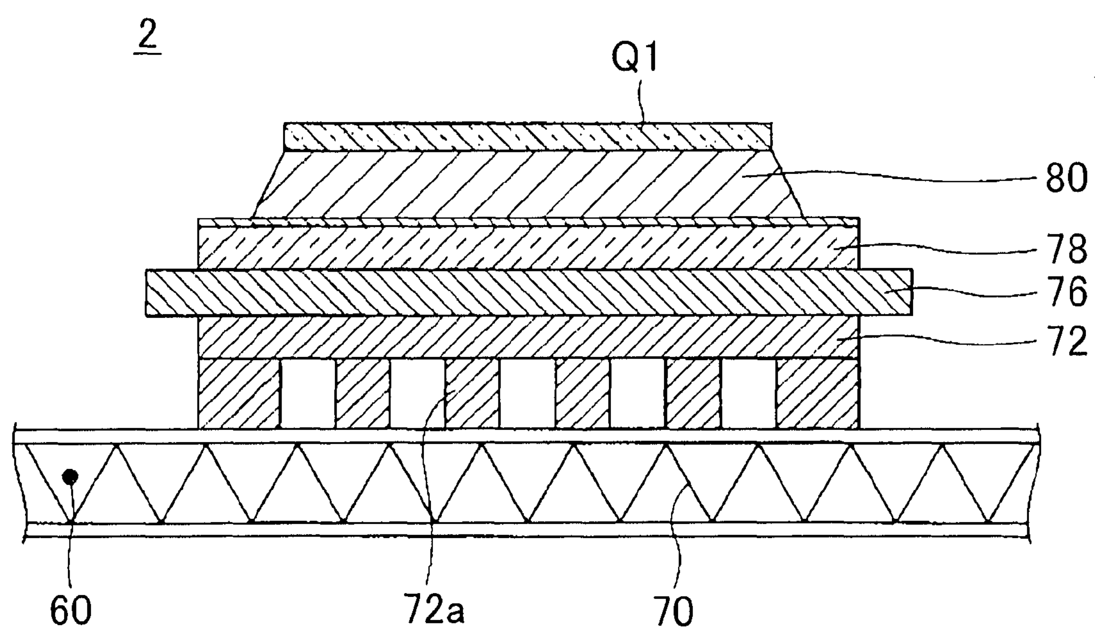
FIG. 2 is a cross-sectional view illustrating an example of the cooling structure of an inverter.

FIG. 2 is a cross-sectional view illustrating an example of a cooling structure 2 of the inverter 30. The inverter 30 may have any cooling structure, an example thereof being the configuration depicted in the FIG. 2. FIG. 2 depicts the portion of the switching element Q1, but the same configuration may be used for other switching elements Q2 to Q6. The vertical direction of the cooling structure 2 of the inverter 30 differs according to the installation state of the cooling structure 2 of the inverter 30, but hereinbelow, for the sake of convenience, the side (upper side in FIG. 2) where the switching element Q1 is present with respect to a heat spreader 78 is taken as the upper side.

In the example shown in FIG. 2, the cooling structure 2 of the inverter 30 includes a cooler 70, a heat sink 72, an insulating member 76, and the heat spreader 78.

The cooler 70 forms a coolant flow path. A heat exchanger or a pump (not shown in the figure) may be provided in the coolant flow path. Further, the water temperature sensor 60 is provided in the coolant flow path. The water temperature sensor 60 may be disposed at any position of the coolant flow path inside the cooler 70. For example, the water temperature sensor 60 may be provided upstream (for example, between the heat exchanger and the flow path portion relating to the inverter 30) of the flow path portion relating to the inverter 30 in the coolant flow path. The coolant flow path may also cool other heat-generating parts, in addition to the inverter 30.

The cooler 70 is disposed to be in contact with fins 72*a* of the heat sink 72. As a result, the coolant circulating in the cooler 70 may receive heat from the heat sink 72. The cooler 70 may be also configured to form a water path in cooperation with the fins 72*a* of the heat sink 72. In this case, the coolant passes between the fins 72*a* of the heat sink 72 and receives heat from the heat sink 72. The number and arrangement form of the fins 72*a* are not limited. The fins 72*a* may be pin fins disposed in a zigzag pattern or straight fins.

The heat sink 72 is formed from a material with good thermal conductivity, for example, from a metal such as aluminum. As mentioned hereinabove, the heat sink 72 is provided with the fins 72*a* on the lower surface side.

The insulating member 76 is formed from an insulating material with good thermal conductivity, for example, from aluminum nitride. The insulating member 76 may be also formed from a resin adhesive or a resin sheet. For example, it may be formed from a resin including alumina as a filler.

The heat spreader 78 is a member that absorbs and diffuses the heat generated by the switching element Q1. The heat spreader 78 is formed from a metal with excellent heat diffusion ability, for example, copper or aluminum. The upper surface side (side in contact with the switching element Q1) of the heat spreader 78 may be plated (for example, plated with nickel) to increase solder wetting ability.

The switching element Q1 is joined by a solder 80 on top of the heat spreader 78. A diode D1 may be mounted together with the switching element Q1 on the heat spreader 78. In this case, the cooler 70 cools both the switching element Q1 and the diode D1.

The cooler 70, the heat sink 72, and the insulating member 76 may be also used together with other switching elements Q2 to Q6, or with some of the other switching elements Q2 to Q6, or only with the switching element Q1 and the diode D1.

Figure 3:
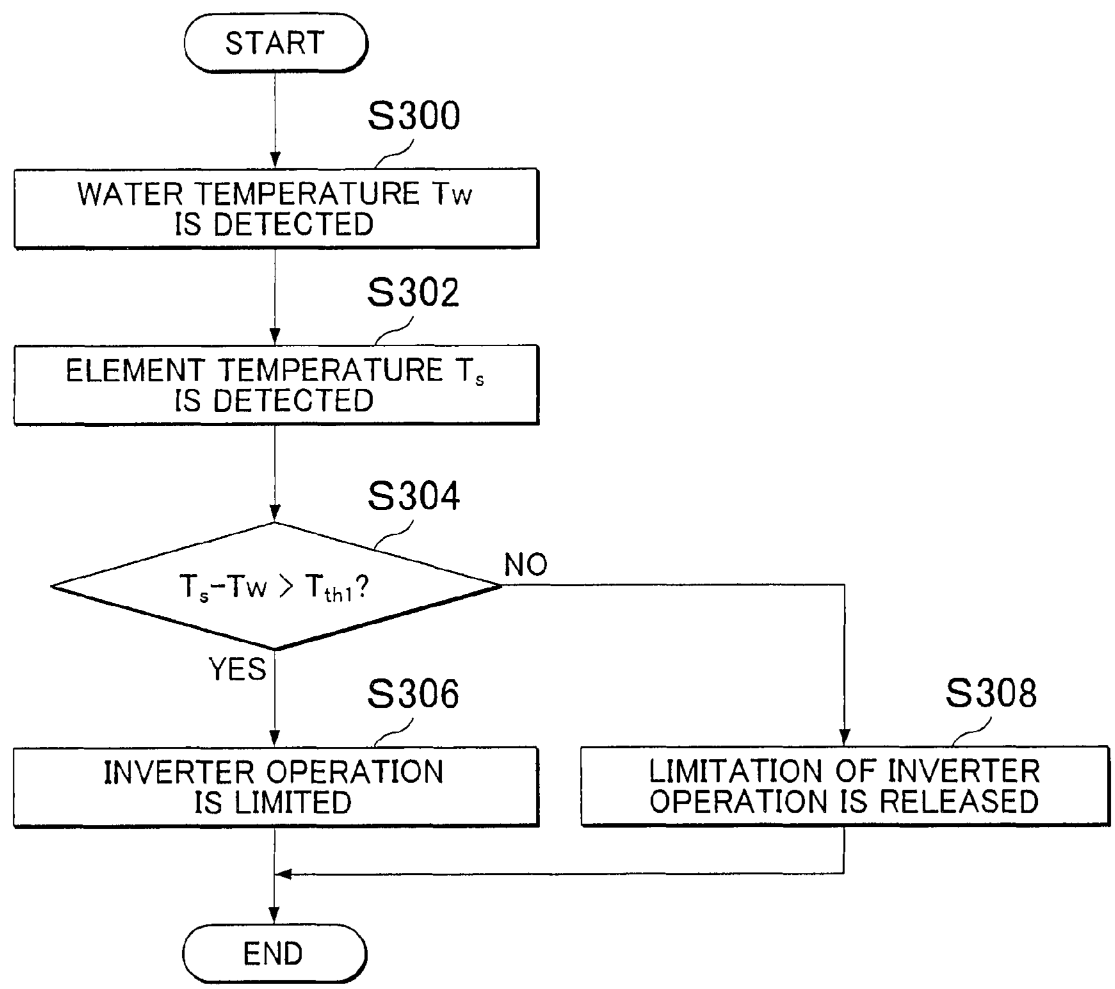
FIG. 3 is a flowchart illustrating an example of processing executed by a semiconductor controller.

FIG. 3 is a flowchart illustrating an example of processing executed by the semiconductor controller 50. The processing depicted in FIG. 3 may be executed, for example, at predetermined period intervals during the operation of the inverter 30. Here, the processing relating to the switching element Q1 is described by way of example. The same processing may be independently executed with respect to other switching elements Q2 to Q6 (the processing of step 300 may be common thereto).

In step 300, the present water temperature Tw is detected on the basis of the newest information from the water temperature sensor 60.

In step 302, the present element temperature $T_s$ of the switching element Q1 is detected on the basis of the newest information on the switching element Q1 from the element temperature sensor 62.

In step 304, it is determined whether or not the temperature increase amount of the switching element Q1 with respect to the coolant temperature, that is, the difference ($=T_s-Tw$) between the element temperature $T_s$ and the water temperature Tw, has exceeded a predetermined threshold $T_{th1}$. The predetermined threshold $T_{th1}$ corresponds to the lower limit value of the range that can be assumed by the temperature increase amount (difference between the element temperature $T_s$ and the water temperature Tw) of the switching element Q1 when the switching element Q1 is fractured due to thermal stresses (cracks occur or the switching element separates from the solder 80). This predetermined threshold may be determined experimentally or analytically. In this case, the predetermined threshold $T_{th1}$ may be set for each water temperature (or predetermined water temperature range). Alternatively, the predetermined threshold $T_{th1}$ may simply have a constant value. Thus, the predetermined threshold $T_{th1}$ may be constant regardless of water temperature or element temperature. However, the predetermined threshold $T_{th1}$ is set such that the element temperature $T_s$ does not exceed the heat resistance temperature of the switching element Q1. Thus, when a condition of (water temperature Tw+predetermined threshold $T_{th1}$)≥(heat resistance temperature) is fulfilled, the predetermined threshold $T_{th1}$ may correspond to a value obtained by subtracting the water temperature Tw from the heat resistance temperature (or a value obtained by further subtracting a predetermined margin). The heat resistance temperature corresponds to an upper limit temperature at which the switching element Q1 is thermally fractured, and a designed value may be used therefor.

Where the difference between the element temperature $T_s$ and the water temperature Tw exceeds the predetermined threshold $T_{th1}$ in the present step 304, the processing advances to step 306, otherwise the processing advances to step 308.

In step 306, the operation of the inverter 30 is limited such that the difference between the element temperature $T_s$ and the water temperature Tw does not exceed the predetermined threshold $T_{th1}$. Where the operation of the inverter 30 has been already limited at present, the limited state is maintained and the processing of the present period ends as is.

Any method may be used for limiting the operation of the inverter 30 in step 306. The limitation of the operation of the inverter 30 may be realized by limiting the output of the inverter 30. For example, the limitation of the output of the inverter 30 may be realized by correcting the required torque determined according to the accelerator depression amount and vehicle speed (corrected in the direction of decreasing). The correction in the direction of decreasing may be executed with respect to the required torque or with respect to another control value (for example, a target voltage value, a target current value, and a target duty) derived according to the required torque. Further, the limitation of the output of the inverter 30 may be also realized by correcting (correcting in the direction of decreasing) the upper limit value (upper limit guard value) for the required torque or a control value based thereon. The limitation of the operation of the inverter 30 may be also realized by correcting (correcting in the direction of decreasing) the carrier frequency of duty control. Furthermore, the limitation of the operation of the inverter 30 may be executed in a stepwise manner. For example, where the difference between the element temperature $T_s$ and the water temperature exceeds the predetermined threshold $T_{th1}$, but the element temperature $T_s$ is not close to the heat resistance temperature, the limitation of the operation of the inverter 30 may be realized by correcting (correction in the direction of decreasing) the carrier frequency of duty control, and where the difference between the element temperature $T_2$ and the water temperature exceeds the predetermined threshold $T_{th1}$ and the element temperature $T_s$ is close to the heat resistance temperature, the limitation of the operation of the inverter 30 may be realized by controlling the output of the inverter 30. Further, the degree of limitation of the operation of the inverter 30 (the amount of decreasing the output of the inverter 30, or the decreasing rate of the output of the inverter 30) may be changed according to the difference between the element temperature $T_s$ and the water temperature or the element temperature $T_s$. For example, the degree of limitation of the operation of the inverter 30 may be raised with the increase in difference between the element temperature $T_s$ and the water temperature. In this case, a plurality of thresholds corresponding to the predetermined threshold $T_{th1}$ may be prepared, and the degree of limitation of the operation of the inverter 30 may be changed in a large number of steps. Alternatively, when the element temperature $T_s$ is close to the heat resistance temperature, the degree of limitation may be raised as the element temperature $T_s$ approaches the heat resistance temperature.

In step 308, the operation limit of the inverter 30 is released. Thus, the operation limit in step 306 that has been executed or maintained in the previous period is released. Where the operation of the inverter 30 is not limited at the present time, the non-limited state is maintained and the processing of the present period is ended as is.

Since the above-described processing relates to the switching element Q1, the limitation of the operation of the inverter 30 in step 306 may be executed only with respect to the arm relating to the switching element Q1, or may be executed with respect to the entire inverter 30.

In the processing depicted in FIG. 3, the element temperature $T_s$ of the switching element Q1 is monitored, but the element temperature of the diode D1 connected in parallel with the switching element Q1 may be also monitored.

Further, the processing depicted in FIG. 3 relates to the switching element Q1, but it may be also executed with respect to the entire inverter 30 (the switching elements Q1 to Q6). In this case, the processing of step 304 may be similarly executed with respect to the element temperature $T_s$ of other switching elements Q2 to Q6. In this case, where the difference between the element temperature $T_s$ and the water temperature Tw for at least any of the switching elements Q1 to Q6 exceeds the predetermined threshold $T_{th1}$, the processing may advance to step 306, and where the difference between the element temperature $T_s$ and the water temperature Tw for all of the switching elements Q1 to Q6 does not exceed the predetermined threshold $T_{th1}$, the processing may advance to step 308. Alternatively, where the difference between the average value of the element temperatures $T_s$ of the switching elements Q1 to Q6 and the water temperature Tw exceeds the predetermined threshold $T_{th1}$, the processing may advance to step 306. Otherwise the processing may advance to step 308.

Figure 4:
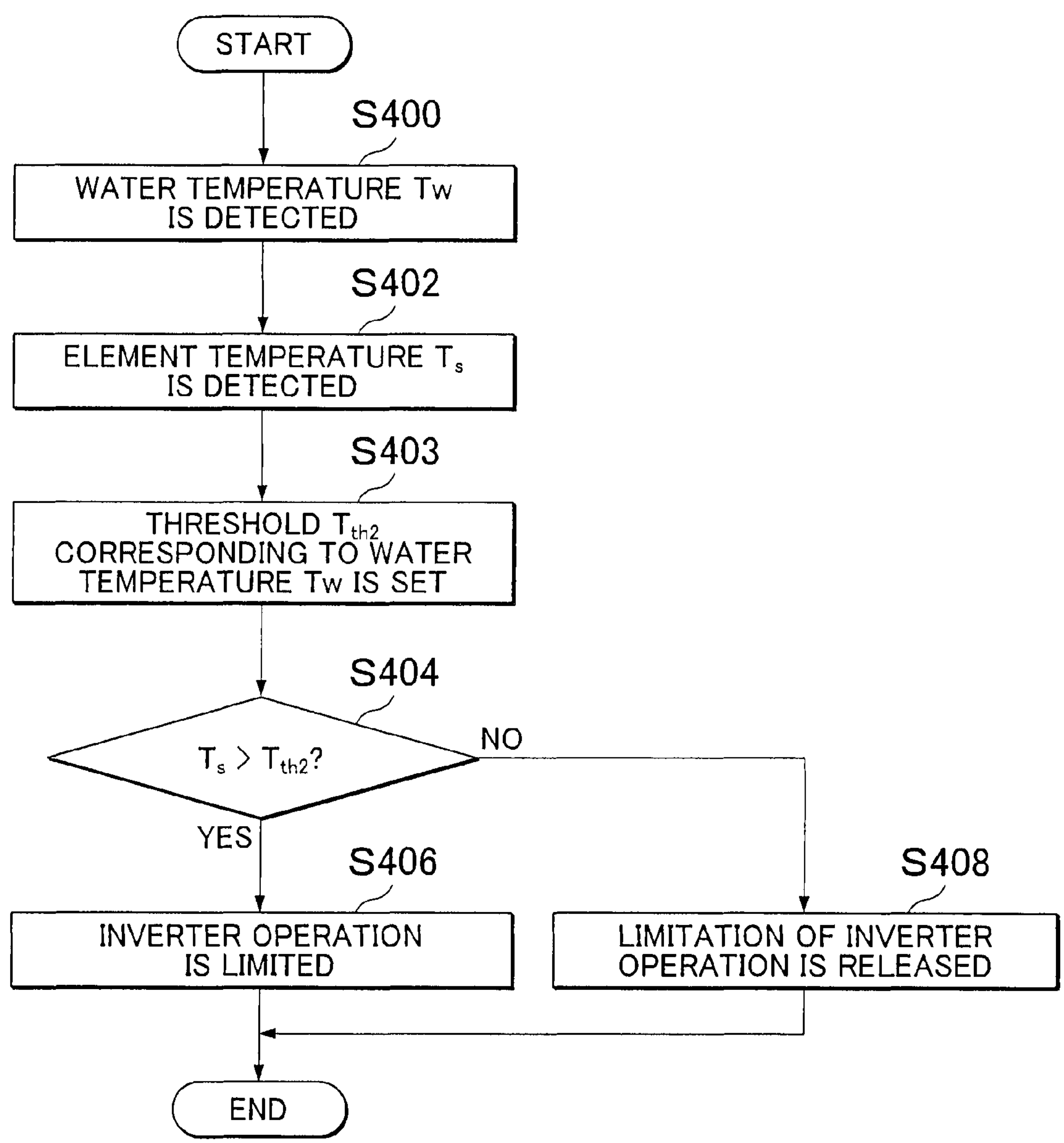
FIG. 4 is a flowchart illustrating another example of processing executed by a semiconductor controller.

FIG. 4 is a flowchart illustrating another example of the processing executed by the semiconductor controller 50. The processing depicted in FIG. 4 may be executed at predetermined period intervals during the operation of the inverter 30. The processing depicted in FIG. 4 is essentially equivalent to that depicted in FIG. 3, and only the processing of step 403 and step 404 is different. The processing of step 400, step 402, step 406, and step 408 may be the same as the processing of step 300, step 302, step 306, and step 308, respectively.

In step 403, the predetermined threshold $T_{th2}$ corresponding to the water temperature Tw detected in step 400 is set. The predetermined threshold $T_{th2}$ can be changed to increase as the water temperature Tw rises. The predetermined threshold $T_{th2}$ corresponds to the lower limit value of the range that can be assumed by the element temperature $T_s$ of the switching element Q1 when the switching element Q1 is fractured due to thermal stresses. This predetermined threshold may be determined experimentally or analytically. The predetermined threshold $T_{th2}$ may simply be a value that is higher by a predetermined value $\Delta T$ than the water temperature Tw. In this case, the predetermined value $\Delta T$ corresponds to the predetermined threshold $T_{th1}$ in the example depicted in FIG. 3, and in this aspect, the processing depicted in FIG. 4 is essentially equivalent to that in the example depicted in FIG. 3. The predetermined threshold $T_{th2}$ may have a heat resistance temperature of the switching element Q1 (or a value obtained by subtracting a predetermined margin from the heat resistance temperature) as the upper limit value.

In step 404, it is determined whether or not the element temperature $T_s$ detected in step 402 exceeds the predetermined threshold $T_{th2}$ that has been set in step 403. Where the element temperature Ts exceeds the predetermined threshold $T_{th2}$, the processing advances to step 406. Otherwise the processing advances to step 408.

In the processing depicted in FIG. 4, the element temperature $T_s$ of the switching element Q1 is monitored, but the element temperature of the diode D1 connected in parallel with the switching element Q1 may be also monitored.

Further, the processing depicted in FIG. 4 relates to the switching element Q1, but it may be also executed with respect to the entire inverter 30 (the switching elements Q1 to Q6). In this case, the processing of step 404 may be similarly executed with respect to the element temperature $T_s$ of other switching elements Q2 to Q6. Where the element temperature $T_s$ for at least any of the switching elements Q1 to Q6 exceeds the predetermined threshold $T_{th2}$, the processing may advance to step 406, and where the element temperature $T_s$ for all of the switching elements Q1 to Q6 does not exceed the predetermined threshold $T_{th2}$, the processing may advance to step 408. Alternatively, where the average value of the element temperatures $T_s$ of the switching elements Q1 to Q6 exceeds the predetermined threshold $T_{th2}$, the processing may advance to step 406. Otherwise the processing may advance to step 408.

Figure 5:
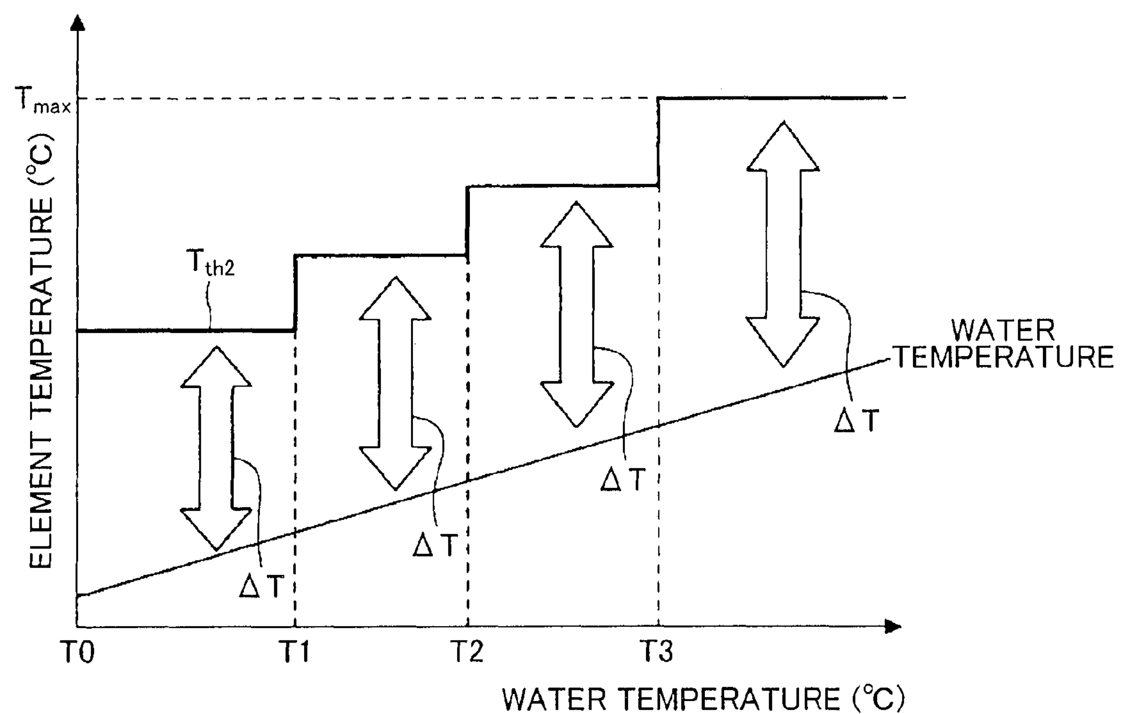
FIG. 5 illustrates an example of the relationship between a predetermined threshold $T_{th2}$ and a water temperature Tw.

FIG. 5 illustrates an example of the relationship between the predetermined threshold $T_{th2}$ and the water temperature Tw used in step 403 depicted in FIG. 4.

In the example depicted in FIG. 5, where the water temperature is within a range from T0 to T1, the predetermined threshold $T_{th2}$ is taken as a value that is higher by the predetermined value ΔT than a predetermined temperature (for example T0) between T0 and T1. Where the water temperature is within a range from T1 to T2, the predetermined threshold $T_{th2}$ is taken as a value that is higher by the predetermined value ΔT than a predetermined temperature (for example T1) between T1 and T2. Where the water temperature is within a range from T2 to T3, the predetermined threshold $T_{th2}$ is taken as a value that is higher by the predetermined value ΔT than a predetermined temperature (for example, T2) between T2 and T3. Where the water temperature is equal to or higher than T3, the predetermined threshold $T_{th2}$ is taken as a value (in the example depicted in FIG. 5, a heat resistance temperature $T_{max}$) that is higher by the predetermined value ΔT than a predetermined temperature (for example, T3) which is equal to or higher than T3.

In the example depicted in FIG. 5, the predetermined value ΔT is simply the same for all sectors, but a suitable value (a value that can differ between the sectors) may be also set according to experimental or analytical results. However, in a range of low water temperature (for example, when the water temperature is within a range from T0 to T1), the predetermined threshold $T_{th2}$ is taken to be significantly less than the heat resistance temperature $T_{max}$. This is done to prevent the switching element Q1 from the fracture (described hereinbelow) caused by thermal stresses. In the example depicted in FIG. 5, the water temperature range is divided into four sectors (T0 to T1, T1 to T2, T2 to T3, and T3 or higher), but the form of division (number or width of the sectors) is not limited. For example, the case in which the water temperature range is divided into a very large number of sectors and the sectors have the same predetermined value ΔT is equivalent to the case in which the predetermined threshold $T_{th1}$ used in the processing depicted in FIG. 3 is constant.

Figure 6:
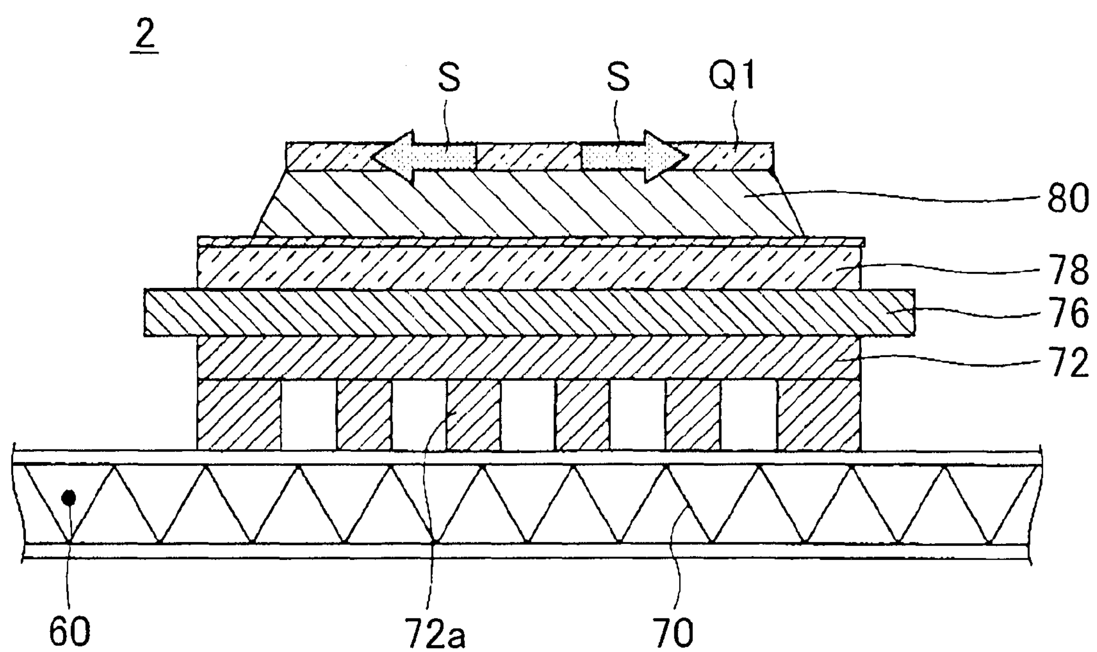
FIG. 6 is an explanatory drawing illustrating the generation principle of fracture (thermal fracture) of a switching element caused by thermal stresses.

FIG. 6 is an explanatory drawing illustrating the generation principle of fracture (thermal fracture) of the switching element Q1 caused by thermal stresses. The explanation illustrated by FIG. 6 relates to the switching element Q1, but it can be also applied to other switching elements Q2 to Q6.

Typically, where the heat generation amount of the switching element Q1 increases from a state in which the element temperature $T_s$ of the switching element Q1 is equal to the water temperature Tw, the generated heat causes a difference occurring between the thermal deformation amount of the switching element Q1 and the thermal deformation amount of the constituent elements (heat sink 72, insulating member 76, heat spreader 78, and solder 80) located below the switching element Q1. This difference in thermal deformation amount is caused by the difference in thermal expansion coefficient between the switching element Q1 and the constituent elements located below the switching element Q1 and the difference between the element temperature $T_s$ of the switching element Q1 and the water temperature Tw. This difference in thermal deformation amount causes thermal stresses (compressive or tensile stresses) in the switching element Q1. In the example depicted in FIG. 6, the thermal expansion coefficient of the switching element Q1 is significantly less than that of the heat sink 72, the heat spreader 78, and the solder 80. In this case, the thermal expansion amount of the constituent elements located below the switching element Q1 becomes larger than that of the switching element Q1, and as depicted schematically in FIG. 6, tensile stresses S are generated in the switching element Q1. Where the stresses generated in the switching element Q1 are large, they can cause the fracture of the switching element Q1. Therefore, it would be useful to limit the operation of the switching element Q1 so that the stresses caused by such difference irt thermal deformation amount when the element temperature $T_s$ of the switching element Q1 changes could not reach a level at which the switching element Q1 can be fractured.

In this case, as mentioned hereinabove, the difference in thermal deformation amount when the element temperature $T_s$ of the switching element Q1 changes is correlated with the difference between the element temperature $T_s$ of the switching element Q1 and the water temperature Tw. Thus, for example, where the water temperature Tw is 0 degrees and the element temperature $T_s$ rises from 0 degrees to 100 degrees (referred to hereinbelow as "case 1") and where the water temperature Tw is 80 degrees and the element temperature $T_s$ rises from 80 degrees to 100 degrees (referred to hereinbelow as "case 2"), the difference in thermal deformation amount between the switching element Q1 and the constituent elements located below the switching element Q1 in case 1 is larger than that in case 2. Thus, even though the element temperature $T_s$ rises to the same level (100 degrees), the probability of the switching element Q1 being fractured differs depending on the difference in the water temperature Tw at this time. This is because the elongation amount (thermal expansion amount) of the solder 80 located below the switching element Q1 which occurs as the element temperature $T_s$ of the switching element Q1 changes is larger in case 1 than in case 2. The effect is actually produced also by the thermal deformation of the constituent elements (heat sink 72, insulating member 76, and heat spreader 78) located below the solder 80, but basically the difference in thermal deformation amount in case 1 is larger than in case 2, and the probability of the switching element Q1 being fractured rises.

In this regard, according to the present embodiment, the operation of the inverter 30 is limited according to the difference between the element temperature $T_s$ of the switching element Q1 and the water temperature Tw, as described hereinabove, and therefore the probability of the switching element Q1 being fractured due to thermal stresses can be reduced.

Figure 7:
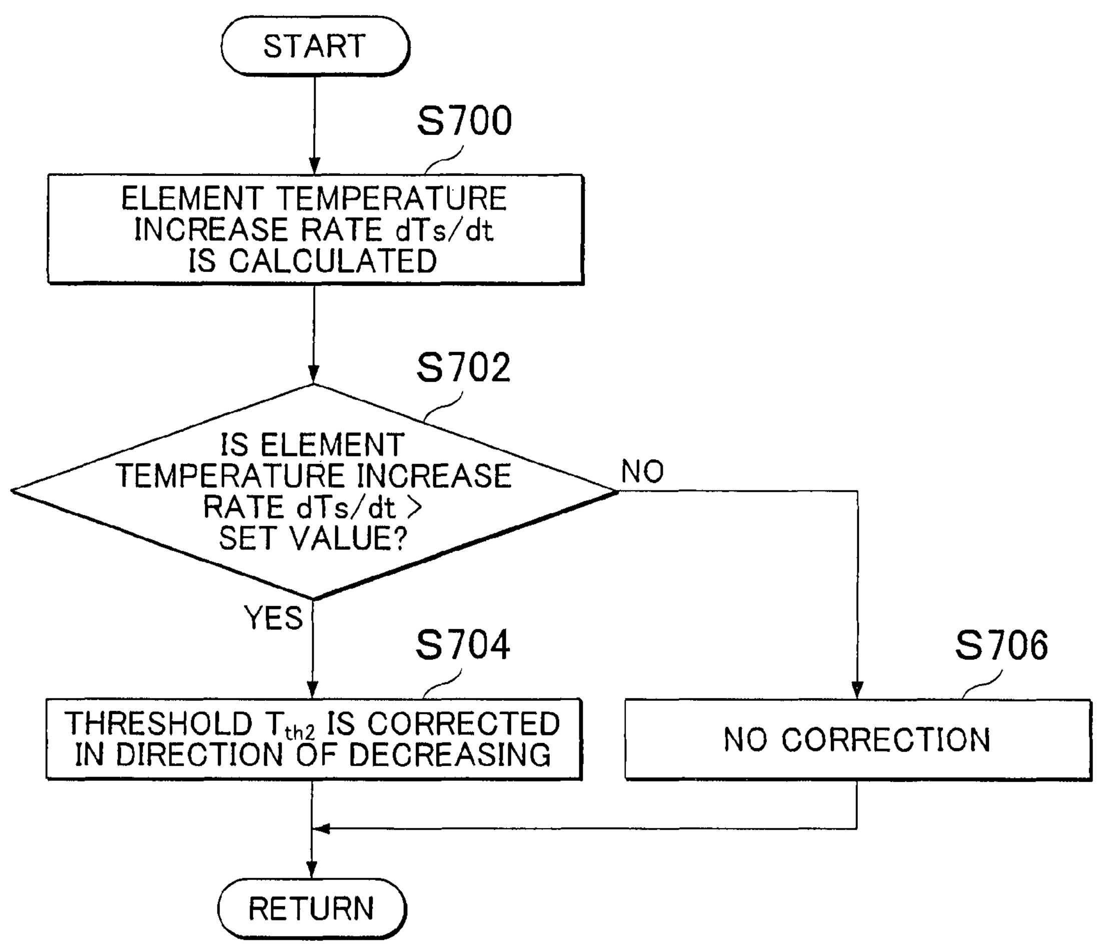
FIG. 7 is a flowchart illustrating an example of a method for changing the predetermined threshold $T_{th2}$ with consideration for the element temperature increase rate.

FIG. 7 is a flowchart illustrating an example of a method for changing the predetermined threshold $T_{th2}$ with consideration for the element temperature increase rate. The processing routine depicted in FIG. 7 may be executed, for example, at predetermined period intervals during the operation of the inverter 30. The processing routine depicted in FIG. 7 may be optionally included between the processing of step 403 and the processing of step 404 in the processing depicted in FIG. 4.

In step 700, the increase rate $dT_s/dt$ of the element temperature $T_s$ per unit time (referred to hereinbelow as element temperature increase rate $dT_s/dt$) is calculated. The element temperature increase rate $dT_s/dt$ may be the increase rate of the element temperature $T_s$ per any unit time. For example, the element temperature increase rate $dT_s/dt$ may be the difference between the preceding and present values of the element temperature $T_s$.

In step 702, it is determined whether or not the element temperature increase rate $dT_s/dt$ is greater than a predetermined value $\alpha$. An example of a method for setting the predetermined value $\alpha$ is described below. Where the element temperature increase rate $dT_s/dt$ is greater than the predetermined value $\alpha$, the processing advances to step 704. Otherwise, the processing advances to step 706.

In step 704, the predetermined threshold $T_{th2}$ is corrected in the direction of decreasing. Thus, the predetermined threshold $T_{th2}$ is corrected to facilitate the limitation of the operation of the inverter 30.

In step 706, the predetermined threshold $T_{th2}$ is left as is, that is, without correction. When the processing routine depicted in FIG. 7 is included between the processing of step 403 and the processing of step 404 in the processing depicted in FIG. 4, the processing of step 706 is omitted, and the predetermined threshold $T_{th2}$ that has been set in step 403 is used as is in step 404.

Figure 8:
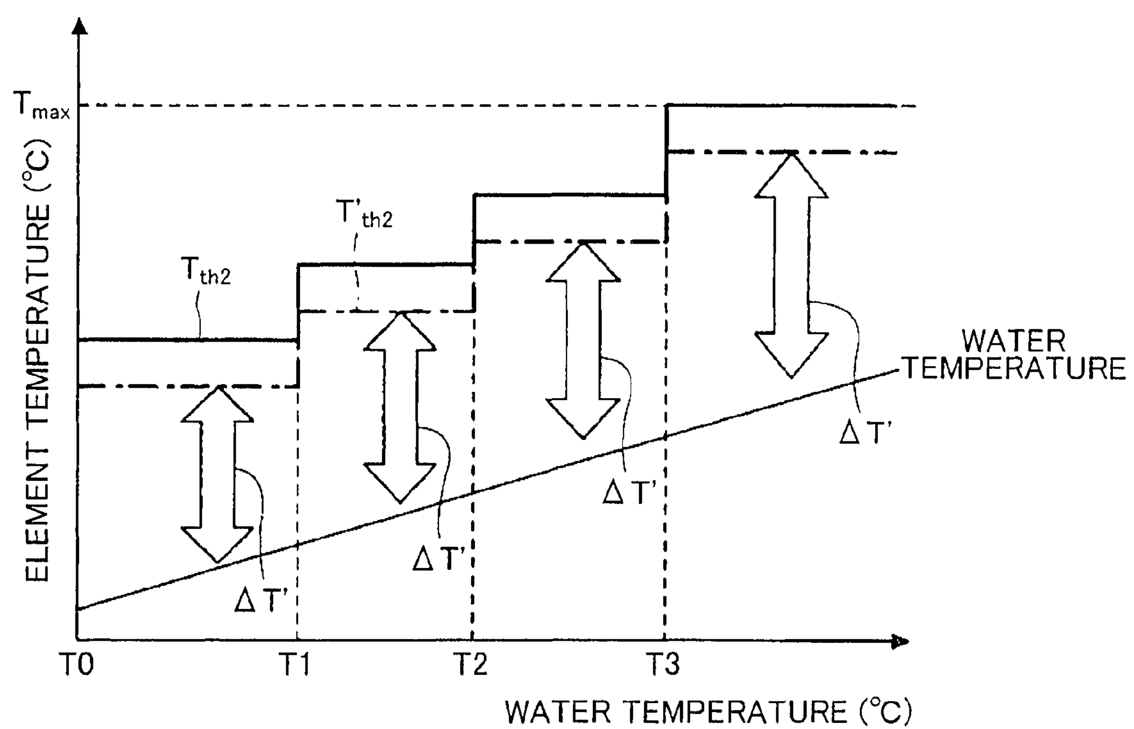
FIG. 8 illustrates an example of a method for changing the predetermined threshold $T_{th2}$ according to the element temperature increase rate.

FIG. 8 illustrates an example of a method for changing the predetermined threshold $T_{th2}$ according to the element temperature increase rate which is related to the processing depicted in FIG. 7.

In FIG. 8, the predetermined threshold $T_{th2}$ after the correction (step 704) is depicted by a dot-dash line as "predetermined threshold $T'_{th2}$". In the example depicted in FIG. 8, as compared with the example depicted in FIG. 5, the predetermined threshold $T'_{th2}$ is set by changing the predetermined value $\Delta T$ to a predetermined value $\Delta T'$. Thus, the predetermined threshold $T'_{th2}$ is determined according to the water temperature in the same manner as the predetermined threshold $T_{th2}$ before the correction, but the predetermined value $\Delta T'$ is set to be less than the predetermined value $\Delta T$.

Figure 9:
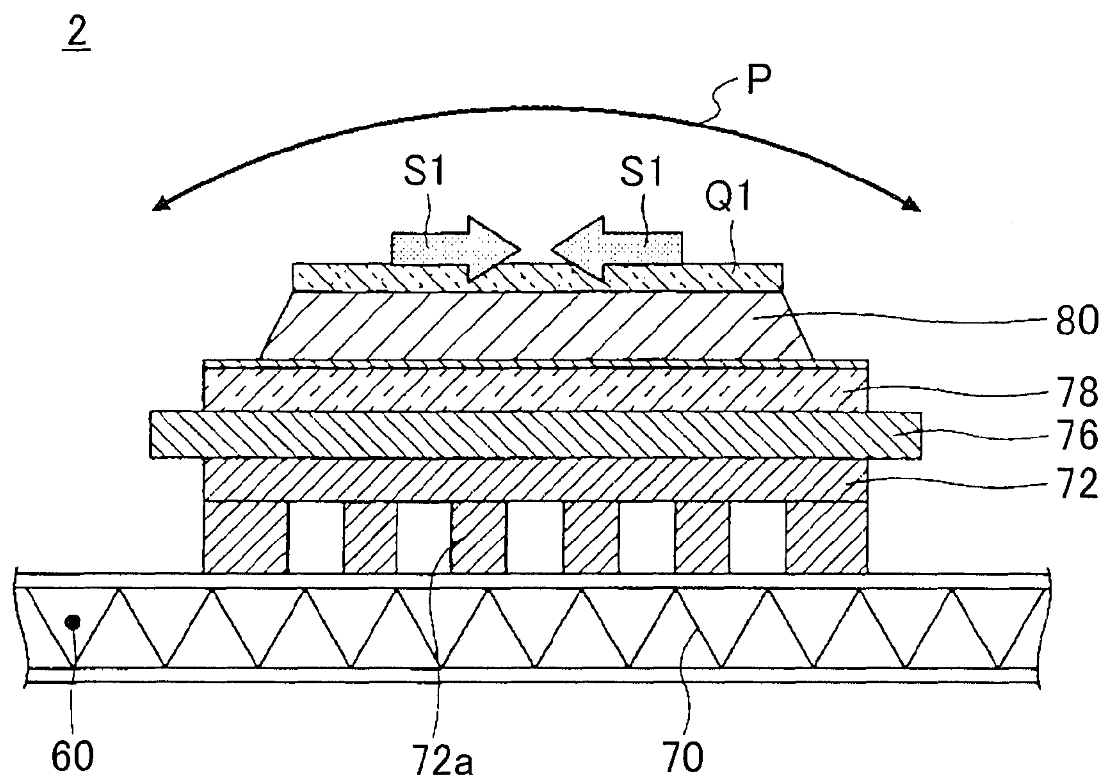
FIG. 9 is an explanatory drawing illustrating the generation principle of fracture (thermal fracture) of a switching element when the element temperature increase rate is high.

FIG. 9 is an explanatory drawing illustrating the generation principle of fracture (thermal fracture) of the switching element Q1 when the element temperature increase rate is high.

Where the element temperature of the switching element Q1 rises rapidly (where the element temperature increase rate is high), since the heat is not immediately transferred to the constituent elements (for example, the heat sink 72 and the insulating member 76) located below the switching element Q1, the difference between the element temperature $T_s$ of the switching element Q1 and the temperature of the constituent elements located below the switching element Q1 increases. Thus, even when the increase in the element temperature $T_s$ of the switching element Q1 is the same, the difference between the element temperature $T_s$ of the switching element Q1 and the temperature of the constituent elements located below the switching element Q1 temporarily increases as the increase rate of the element temperature $T_s$ of the switching element Q1 rises.

In this case, the constituent elements located below the switching element

Q1 temporarily restrain the end portions of the switching element Q1, and the switching element Q1 deforms in the direction of bulging to assume a shape that is convex upward, as depicted schematically by an arrow P in FIG. 9. As a result, a compressive stress S1 temporarily appears in the switching element Q1. Where such compressive stress S1 increases, it can cause the fracture of the switching element Q1. Therefore, when the element temperature of the switching element Q1 rapidly changes, it would be useful to limit the operation of the switching element Q1 so that such compressive stress S1 could not reach a level at which the switching element Q1 can be fractured.

In this regard, according to the processing depicted in FIG. 7, the operation of the inverter 30 is easily limited when the element temperature increase rate is high, as described hereinabove, and therefore the probability of the switching element Q1 being fractured due to such compressive stress S1 can be reduced.

The predetermined value $\alpha$ that is used in step 702 depicted in FIG. 7 may be set from this standpoint. For example, the predetermined value $\alpha$ corresponds to the lower limit value of the range that can be assumed by the element temperature increase rate at which the compressive stress S1 capable of fracturing the switching element Q1 is generated, and this predetermined value may be determined experimentally or analytically. Further, the predetermined value $\alpha$ may be set for each water temperature Tw (or for each predetermined water temperature range). Alternatively, the predetermined value $\alpha$ may be simply made constant, regardless of the water temperature Tw.

In the processing depicted in FIG. 7, the predetermined threshold $T_{th2}$ is set to two levels according to whether or not the element temperature increase rate $dT_s/dt$ exceeds the predetermined value $\alpha$, but the predetermined threshold $T_{th2}$ may be also varied more finely according to the element temperature increase rate $dT_s/dt$. In this case, the predetermined threshold $T_{th2}$ may be varied (corrected) to assume a smaller value as the element temperature increase rate $dT_s/dt$ increases.

In the processing depicted in FIG. 7, the predetermined threshold $T_{th2}$ is corrected such that the predetermined threshold $T_{th2}$ decreases as the element temperature increase rate $dT_s/dt$ increases, but an equivalent approach may involve increasing the limitation degree of the operation of the inverter 30 as the element temperature increase rate $dT_s/dt$ increases.

Further, the processing routine depicted in FIG. 7 may be optionally included between the processing of step 302 and the processing of step 304 in the processing depicted in FIG. 3. In this case, in step 704, the predetermined threshold $T_{th1}$ that is used in step 304 may be corrected in the direction of decreasing. Thus, the predetermined threshold $T_{th1}$ may be corrected to facilitate the limitation of the operation of the inverter 30.

The embodiments are described hereinabove in detail, but the specific embodiments are not limiting. Further, all of the constituent elements, or a plurality thereof, in the above-described embodiments may be combined together.

For example, in the embodiments, the operation of the inverter 30 is limited using the detection result on the element temperature $T_s$, but it is also possible to use the detection result on the element temperature $T_s$ only in relation with the heat resistance temperature and limit the operation of the inverter 30 according to the water temperature Tw. Thus, the operation of the inverter 30 may be limited according to the water temperature Tw in an element temperature region in which the element temperature $T_s$ does not reach (or does not approach) the heat resistance temperature. In this case, the operation of the inverter 30 may be also limited such that the difference between the water temperature Tw and the element temperature $T_s$ is within the predetermined value ΔT. For example, the upper limit value (upper limit guard value) corresponding to the required torque or a control value based thereon may be determined according to the water temperature Tw. In this case, the upper limit guard value may be determined experimentally or analytically for each water temperature Tw such that the difference between the water temperature Tw and the element temperature $T_s$ is within the predetermined value ΔT. The predetermined value ΔT may be such as explained in FIGS. 4 and 5. In this case, the effect same as that in the above-descried embodiments can be obtained without using the detection result of the element temperature $T_s$ (by using only in relation with the heat resistance temperature).

Further, in the above-described embodiments, the semiconductor controller 50 controls the inverter 30 and the DC/DC converter 20, but a configuration in which only the inverter 30 is controlled may be also used. Further, the detailed features of the motor drive system 1 are not limited. For example, a configuration in which the motor drive system 1 is not provided with the DC/DC converter 20 may be also used.

Further, in the above-described embodiment, the cooling structure 2 is used for the inverter for a vehicle, but the cooling structure 2 may be also used for the DC/DC converter 20 and a module having other heat-generating elements (for example, the smoothing capacitor C2). Thus, in the above-described embodiments, an example of the onboard electronic device is formed by the inverter 30, the semiconductor controller 50, the water temperature sensor 60, and the element temperature sensor 62, but an example of the onboard electronic device may be also formed by the DC/DC converter 20, the semiconductor controller 50, a water temperature sensor, and an element temperature sensor. In this case, the water temperature sensor may detect the temperature of the coolant cooling the switching elements Q22, Q24 of the DC/DC converter 20, and the element temperature sensor may detect the temperature of the elements such as the switching elements Q22, Q24.

Further, in the above-described embodiments, the substrate to which the switching element Q1, or the like, is joined is the heat spreader, but the switching element Q1, or the like, may be disposed on any other substrate. For example, the substrate for joining the switching element Q1, or the like, may be a direct brazed aluminum (DBA) substrate equipped with an aluminum sheet on both sides of a ceramic substrate, or a direct brazed copper (DBC) substrate equipped with a copper sheet on both sides of a ceramic substrate.

What is claimed is:

1. An onboard electronic device comprising:
an element that generates heat;
a member that is provided between the element and a coolant cooling the element, and differs in thermal expansion coefficient from the element;
an element temperature sensor that detects a temperature of the element;
a coolant temperature sensor that detects a temperature of the coolant; and
a controller that controls operation of the element such that the temperature of the element allowed when the temperature of the coolant is a first temperature is lower than the temperature of the element allowed when the temperature of the coolant is a second temperature that is higher than the first temperature.

2. The onboard electronic device according to claim 1, wherein
the controller limits the operation of the element when the temperature of the element exceeds a threshold, and
the threshold is changed to increase as the temperature of the coolant rises.

3. The onboard electronic device according to claim 2, wherein
the controller increases a limit degree for the operation of the elements when the temperature of the element exceeds the threshold with respect to that when the temperature of the element does not exceed the threshold.

4. The onboard electronic device according to claim 2, wherein
the controller decreases the threshold when an increase rate of the temperature of the element exceeds a predetermined increase rate with respect to that when the temperature of the element does not exceed the predetermined increase rate.

5. The onboard electronic device according to claim 1, wherein
the controller limits the operation of the heat-generating element when a difference between the temperature of the coolant and the temperature of the element exceeds a threshold, and
the threshold when the temperature of the coolant is the first temperature is equal to the threshold when the temperature of the coolant is the second temperature.

6. An onboard electronic device comprising:
an element that generates heat;
a member that is provided between the element and a coolant cooling the element, and differs in thermal expansion coefficient from the element;
a coolant temperature sensor that detects a temperature of the coolant; and
a controller that limits operation of the element on the basis of the temperature of the coolant such that a difference between the temperature of the coolant and a temperature of the element falls within a predetermined range, wherein
the range when the coolant temperature is a first temperature is equal to the range when the coolant temperature is a second temperature that is higher than the first temperature.

7. An onboard electronic device comprising:
an element that generates heat;
a member that is provided between the element and a coolant cooling the element, and differs in thermal expansion coefficient from the element;
an element temperature sensor that detects a temperature of the element; and
a coolant temperature sensor that detects a temperature of the coolant, wherein
the temperature of the element at which output of the element declines is higher when the temperature of the coolant is a second temperature that is higher than a first temperature than when the temperature of the coolant is the first temperature.

8. An onboard electronic device comprising:
an element that generates heat;
a member that is provided between the element and a coolant cooling the element, and differs in thermal expansion coefficient from the element; and
a temperature sensor that detects a temperature of the coolant, wherein
output of the element declines when a difference between the temperature of the coolant and a temperature of the element exceeds a predetermined range, and the predetermined range when the temperature of the coolant is a first temperature is equal to the predetermined range when the temperature of the coolant is a second temperature that is higher than the first temperature.

* * * * *

UNITED STATES PATENT AND TRADEMARK OFFICE
CERTIFICATE OF CORRECTION

PATENT NO. : 9,728,488 B2
APPLICATION NO. : 15/029111
DATED : August 8, 2017
INVENTOR(S) : Hiroto Kusaka It is certified that error appears in the above-identified patent and that said Letters Patent is hereby corrected as shown below:

In the Claims

In Column 14, Line 16, in Claim 4, after "with respect to that when", insert --"the increase rate of"--.

Signed and Sealed this
Fifteenth Day of May, 2018

Andrei Iancu
*Director of the United States Patent and Trademark Office*